US008806291B2

(12) United States Patent
Sato et al.

(10) Patent No.: US 8,806,291 B2
(45) Date of Patent: Aug. 12, 2014

(54) DATA TRANSFER DEVICE AND CONTROL METHOD OF DATA TRANSFER DEVICE

(75) Inventors: Kenta Sato, Kawasaki (JP); Takashi Yamamoto, Kawasaki (JP); Toshikazu Ueki, Kawasaki (JP); Yuka Hosokawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 273 days.

(21) Appl. No.: 13/227,852

(22) Filed: Sep. 8, 2011

(65) Prior Publication Data
US 2011/0320901 A1 Dec. 29, 2011

Related U.S. Application Data

(63) Continuation of application No. PCT/JP2009/054450, filed on Mar. 9, 2009.

(51) Int. Cl.
*H03M 13/00* (2006.01)
*H04L 1/18* (2006.01)
*H04L 1/00* (2006.01)

(52) U.S. Cl.
CPC .......... *H04L 1/1829* (2013.01); *H04L 1/0061* (2013.01); *H04L 1/00* (2013.01)
USPC .......... 714/758; 714/748; 714/752; 714/755

(58) Field of Classification Search
CPC ........ H04L 1/00; H04L 1/0061; H04L 1/1829
USPC .................. 714/748, 752, 755, 758, 749
See application file for complete search history.

(56) References Cited

U.S. PATENT DOCUMENTS

| 5,740,531 A | 4/1998 | Okada |
|---|---|---|
| 6,587,985 B1 | 7/2003 | Fukushima et al. |
| 2002/0023243 A1 | 2/2002 | Tomita |

(Continued)

FOREIGN PATENT DOCUMENTS

| JP | 49-47010 | 5/1974 |
|---|---|---|
| JP | 3-158960 | 7/1991 |

(Continued)

OTHER PUBLICATIONS

International Search Report for PCT/JP2009/054450, mailed Mar. 31, 2009.

(Continued)

*Primary Examiner* — Sam Rizk
(74) *Attorney, Agent, or Firm* — Staas & Halsey LLP (57) ABSTRACT

A data transfer device includes a data transmitting circuit includes an error detection code generating unit generating an error detection code for detecting an error in the data, and a transmission unit transmitting the data and the error detection code together with retransmit enable information representing that corresponding data transmitted before the former data or transmitted next can be retransmitted, the data receiving circuit includes a reception unit receiving the transmitted data, the transmitted error detection code and the transmitted retransmit enable information, an error detection unit detecting the error in the received data based on the error detection code, an error data retaining unit retaining the data in which an error is detected when the reception unit receives the retransmit enable information, and an error data comparing unit that comparing the error detected data retained in the error data retaining unit with corresponding data that is retransmitted.

13 Claims, 11 Drawing Sheets

(56) References Cited

U.S. PATENT DOCUMENTS

| | | | |
|---|---|---|---|
| 2002/0038441 A1 | 3/2002 | Eguchi et al. | |
| 2003/0009717 A1 | 1/2003 | Fukushima et al. | |
| 2003/0226094 A1 | 12/2003 | Fukushima et al. | |
| 2004/0102932 A1 | 5/2004 | Fukushima et al. | |
| 2005/0050424 A1* | 3/2005 | Matsuura | 714/748 |
| 2005/0053093 A1 | 3/2005 | Fukushima et al. | |
| 2007/0079207 A1* | 4/2007 | Seidel et al. | 714/748 |
| 2007/0168824 A1 | 7/2007 | Fukushima et al. | |
| 2008/0209300 A1 | 8/2008 | Fukushima et al. | |
| 2009/0049356 A1* | 2/2009 | Lin | 714/749 |
| 2010/0146355 A1* | 6/2010 | Jiang et al. | 714/749 |

FOREIGN PATENT DOCUMENTS

| | | |
|---|---|---|
| JP | 7-322041 | 12/1995 |
| JP | 8-126047 | 5/1996 |
| JP | 9-307510 | 11/1997 |
| JP | 10-65655 | 3/1998 |
| JP | 10-285098 | 10/1998 |
| JP | 2000-216812 | 8/2000 |
| JP | 2001-119437 | 4/2001 |
| JP | 2002-94487 | 3/2002 |
| JP | 2002-124992 | 4/2002 |

OTHER PUBLICATIONS

International Preliminary Report on Patentability mailed Oct. 27, 2011 issued in corresponding International Patent Application No. PCT/JP2009/054450.

Notice of Reason for Rejection, dated Jul. 16, 2013, in corresponding Japanese Application No. 2011-503585 (6 pp.).

* cited by examiner

DATA TRANSFER DEVICE AND CONTROL METHOD OF DATA TRANSFER DEVICE

CROSS-REFERENCE TO RELATED APPLICATIONS

This is a continuation of Application PCT/JP2009/054450, filed on Mar. 9, 2009, now pending, the entire contents of which are incorporated herein by reference.

FIELD

The present invention discussed herein relates to a data transfer device and a control method of data transfer device.

BACKGROUND

Data transmission between LSIs (Large Scale Integrations) is implemented based on serial transmission of transmitting data packet via a plurality of signal lines with a transmission path being configured to attain a faster speed, which is on the verge of becoming a mainstream.

Note that the data transmission involves, as the case may be, attaching an error correction code to the data in order to correct this error when an error occurs.

In the serial transmission, however, a multiplicity of error bits might occur consecutively due to a burst error, and hence a multiplicity of error correction codes is required for enabling the error bits to be corrected when the burst error occurs. Consequently, the attachment of the error correction codes in the serial transmission causes decreases in throughput and in latency.

Such being the case, the data transfer device on the transmission side has hitherto generated a CRC (Cyclic Redundancy Check) code on a packet-by-packet basis of transmission data and transmits a packet with the CRC code inserted, and a data transfer device on the side of a reception unit performs the CRC of the received packet. Namely, the data transfer device detects as to whether the received packet contains an error or not and makes the correction by retransmitting the packet without correcting the error even if there is the error.

Moreover, technologies disclosed in the following Patent documents are given by way of the prior arts related to the invention of the present application.

[Patent document 1] Japanese Laid-Open Patent Publication No. H10-65655
[Patent document 2] Japanese Laid-Open Patent Publication No. H09-307510

SUMMARY

An aspect of the invention, a data transfer device includes a data transmitting circuit includes an error detection code generating unit generating an error detection code for detecting an error in the data, and a transmission unit transmitting the data and the error detection code together with retransmit enable information representing that corresponding data transmitted before the former data or transmitted next can be retransmitted, the data receiving circuit includes a reception unit receiving the transmitted data, the transmitted error detection code and the transmitted retransmit enable information, an error detection unit detecting the error in the received data based on the error detection code, an error data retaining unit retaining the data in which an error is detected when the reception unit receives the retransmit enable information, and an error data comparing unit that comparing the error detected data retained in the error data retaining unit with corresponding data that is retransmitted.

According to the technology of the disclosure, it is feasible to provide a technology enabling the error portion of the data to be specified by comparing the error-detected data with the retransmitted data.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1:
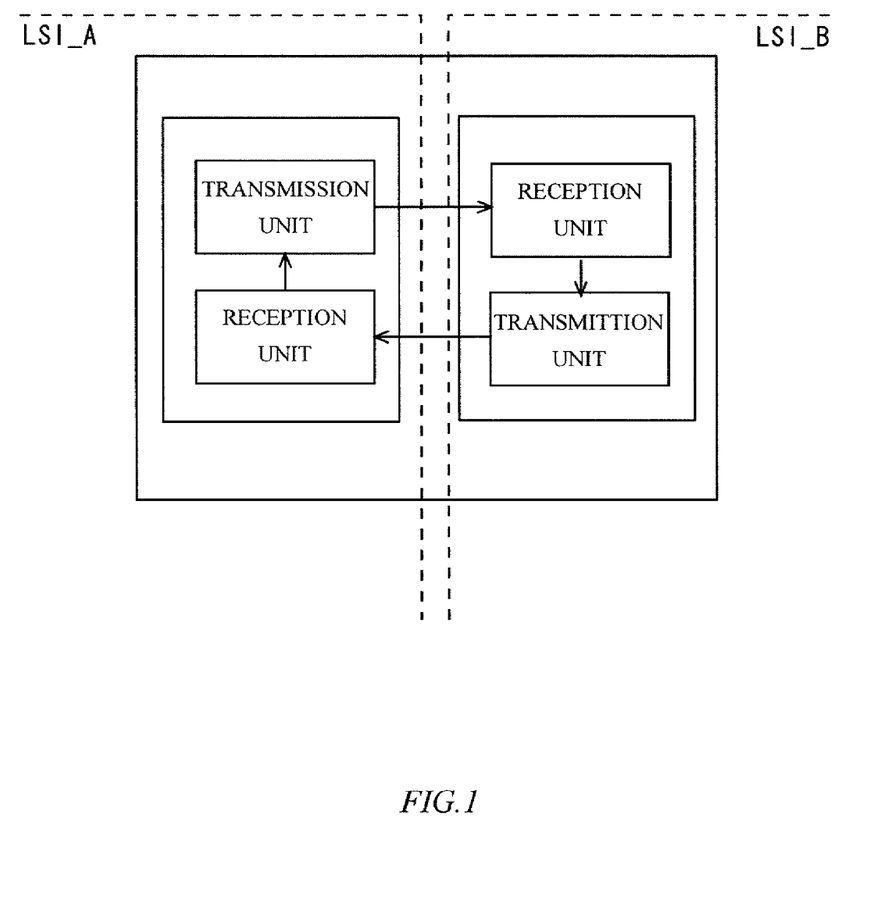
FIG. 1 is a schematic diagram of a data transfer device.

FIG. 1 is a schematic diagram of a data transfer device. A data transfer device 100 in FIG. 1 includes a first transfer circuit 1 and a second transfer circuit 10 via transmission paths 19. LSIs (Large Scale Integrations) on, e.g., different substrates are mounted with the first transfer circuit 1 and the second transfer circuit 10, and these different substrates are connected by the transmission paths 19, thus transferring data. Specifically, the substrate within an operation unit and the substrate within a display unit of a mobile phone are each provided with the first transfer circuit 1 and the second transfer circuit 10, whereby the data is transferred.

In the present example (first embodiment), the first transfer circuit 1 and the second transfer circuit 10 have the same configuration and are capable of transferring the data to each other. In the following discussion, however, for convenience' sake, the description will be made in such a case that the first transfer circuit 1 functions as a data transmitting circuit, while the second transfer circuit 10 functions as a data receiving circuit. Note that the data (datagram) is transmitted as a packet and will hereinafter be therefore referred to as the packet in the first embodiment.

Figure 2:
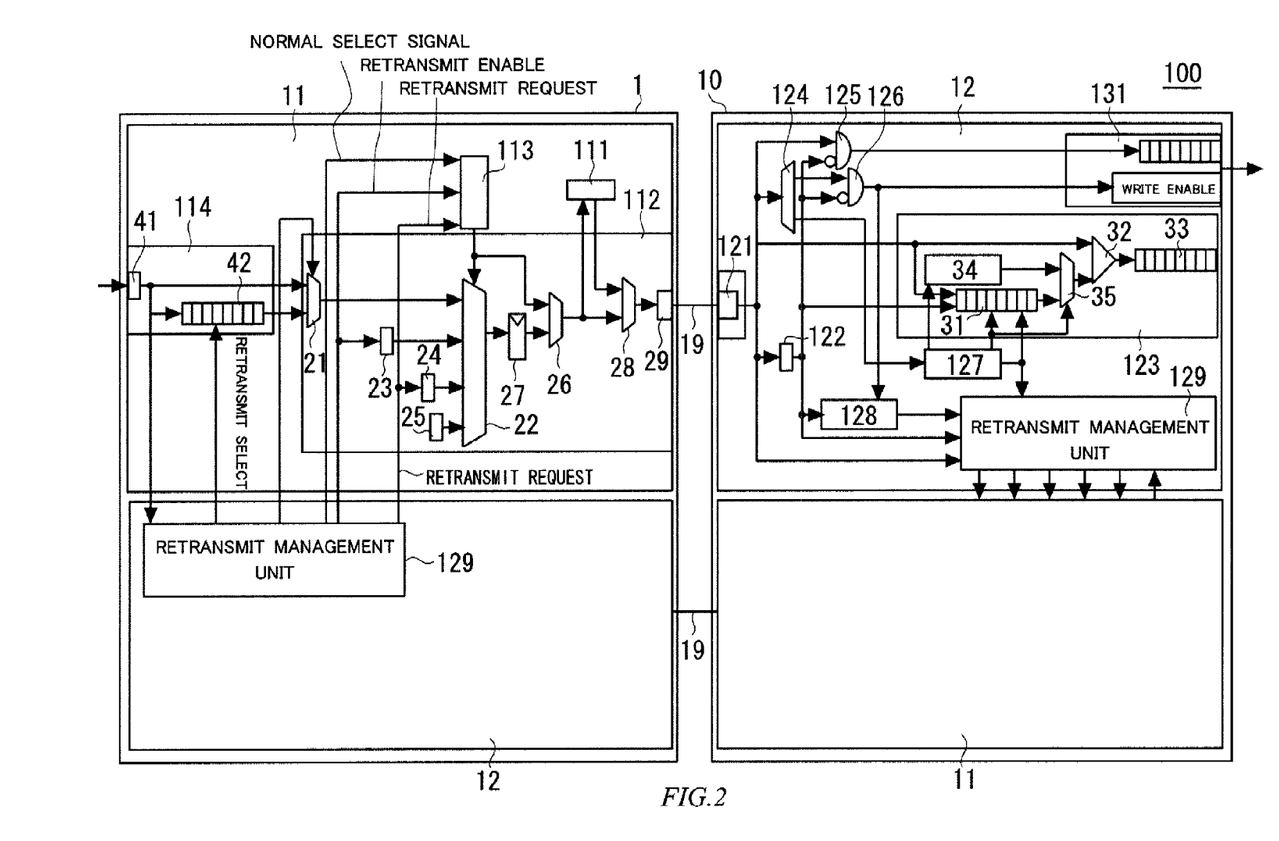
FIG. 2 is a diagram illustrating configurations of a transmission unit on the side of a transmitting circuit and a reception unit on the side of a receiving circuit.
Figure 3:
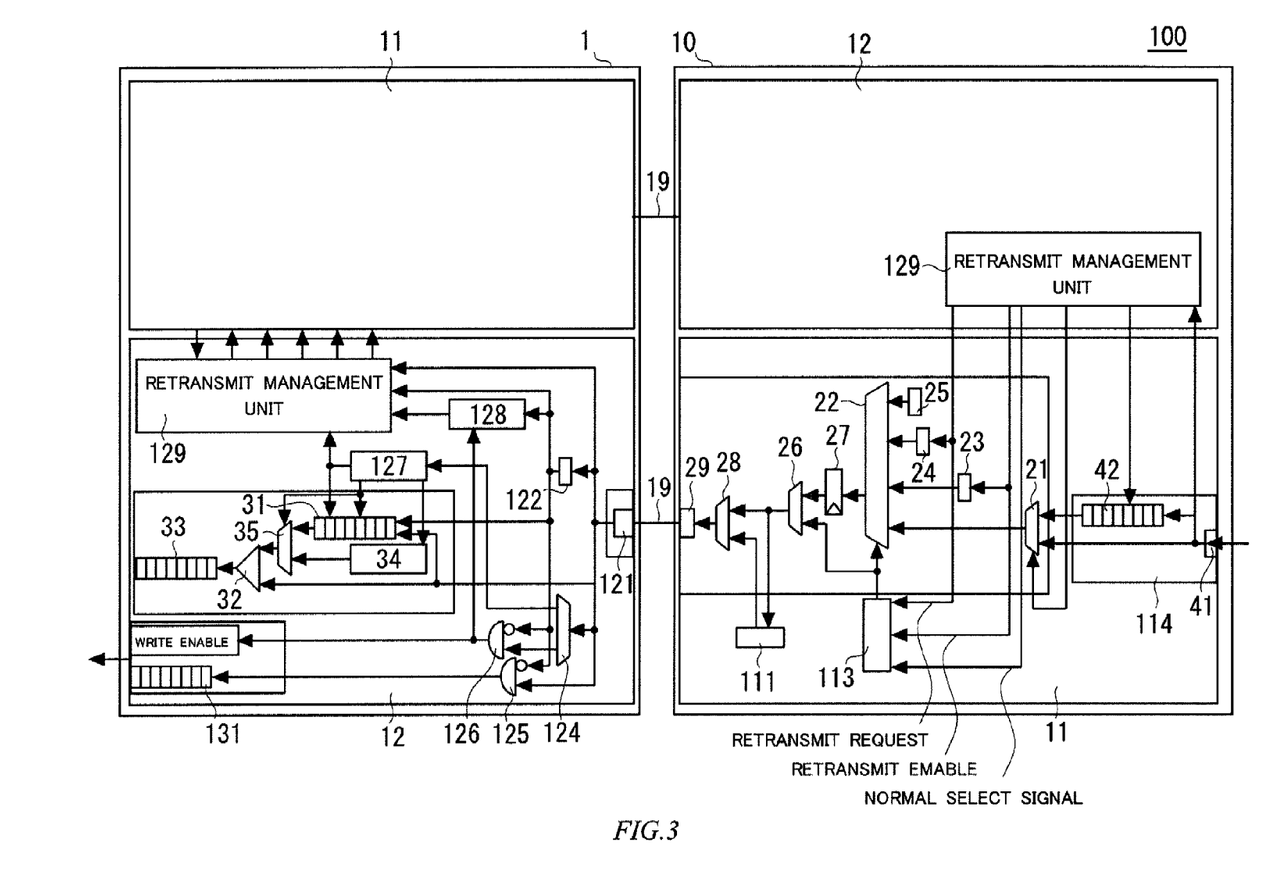
FIG. 3 is a diagram illustrating configurations of the transmission unit on the side of the receiving circuit and the reception unit on the side of the transmitting circuit.

FIG. 2 is a diagram illustrating a configuration of a transmission unit (transmission unit on the side of the transmitting circuit) 11 of the first transfer circuit 1 and a configuration of a reception unit (reception unit on the side of the relieving circuit) 12 of the second transfer circuit 10, which receives the data from the transmission unit 11. Further, FIG. 3 is a diagram illustrating a configuration of the transmission unit (transmission unit on the side of the receiving circuit) 11 of the second transfer circuit 10 and a configuration of the reception unit (reception unit on the side of the transmitting circuit) 12 of the first transfer circuit 1, which receives the data from the transmission unit 11.

The transmission unit 11 includes an error detection code generation unit 111, a data transmitting unit 112, a coder (retransmit information generation unit) 113 and an input unit 114.

The input unit 114 includes an input port 41 to which the packet data transferred from another circuit is inputted, and a buffer 42 stored with the inputted packet. The input unit 114 transmits, to the data transmitting unit 112, the packet inputted to the input port 41 and gets the inputted packet stored in the buffer 42.

The error detection code generation unit 111 generates an error detection code, e.g., a CRC (Cyclic Redundancy Check) code for detecting a packet error on the basis of the packet to be transferred. Note that any inconvenience may not be caused by using, as the error detection code, if capable of detecting whether the error exists or not, a parity check code, a checksum, a hash function based code, etc without being limited to the CRC.

The coder 113 sends, corresponding to a signal transmitted from a retransmit management unit 129 of the reception unit 12, a piece of information, i.e., a packet type in the first embodiment, which specifies the packet to be transmitted next to a data transmission unit 112. The packet type sent from the coder 113 is attached to each packet as retransmission-enabled information, as will be described later on. Namely, the coder 113 in the first embodiment functions as a retransmit information generation unit to generate the retransmission-enabled information.

The data transmitting unit 112 transmits, as attached together to the inputted packet, the error detection code and the packet retransmission-enabled information posterior to the packet (packet data field) to the transmission path 19.

The data transmitting unit 112 in the first embodiment includes selectors 21, 22 which select the packets to be transmitted, packet generation units 23, 24, 25 which generate control packets, and a signal synthesizing unit 26 which inserts (attaches) the packet type into the packet to be transmitted. Further, the data transmission unit 112 includes a delay circuit 27 which adjusts timing of inserting the packet type, a signal synthesizing unit 28 which inserts the CRC code into the packet to be transmitted, and a P/S (Parallel/Serial) converting unit 29 which converts a parallel signal into a serial signal.

The packet generation unit 23 includes a register stored with predetermined-formatted data defined as retransmit initiation packet, and a reading unit which reads the retransmit initiation packet from this register. The packet generation unit 23, when receiving a retransmit enable signal from the retransmit management unit 129, gets the reading unit to read the retransmit initiation packet from the register, and transmits the readout packet to the selector 22.

The retransmit initiation packet is a packet containing, in its header, retransmit initiation information specifying the retransmit initiation and the packet type specifying the retransmit initiation packet in the first embodiment. Namely, the retransmit initiation packet is transmitted before the retransmit packet.

The packet generation unit 24 includes a register stored with information serving as a template of a retransmit request packet, and an adder which adds a retransmit buffer number to the template. Then, the packet generation unit 24, when receiving a retransmit request signal and the retransmit buffer number from the retransmit management unit 129, generates the retransmit request packet by reading the template from the register and adding the retransmit buffer number to the template, and transmits this retransmit packet to the selector 22.

Note that the retransmit request packet is a packet containing, in the header, information (retransmit request information) purporting a request for retransmitting the packet discarded due to occurrence of the error, i.e., the packet type specifying the retransmit request packet.

The packet generation unit 25 includes a register stored with predetermined-formatted data defined as a Null packet and a reading unit which reads the Null packet from this register. The Null packet is periodically output from the packet generation unit 25 and is selectively sent by the selector 22 to the posterior stage when in an idle status.

Note that the Null packet is a fixed packet (with no significant data) containing, in its header, information representing non-existence of any transmission packet and the idle status as well, i.e., the packet type specifying "Null Packet". Herein, the fixed packet is a packet in which a bit pattern is previously fixed. Further, the packets other than the fixed packet (Null packet) are significant data.

The reception unit 12 includes a S/P (Serial/Parallel) converting unit 121, an error detection unit 122, an error determining unit 123, a decoder 124, gate units 125, 126, a packet type determining unit 127, a counter 128, a retransmit management unit 129 and an output unit 131.

The S/P converting unit 121 receives the data transmitted from the transmission unit 11 disposed in a face-to-face relation via the transmission path 19, and converts the received serial data into parallel data.

The error detection unit 122 detects an error of the data received by the S/P converting unit 121 based on the error detection code. In the first embodiment, the error detection unit 122 performs the CRC of each packet on the basis of the CRC code, and outputs "true", i.e., "1" when detecting the error and "false", i.e., "0" when not detecting any error as a result.

The error determining unit 123 includes an error data retaining unit 31, an error data comparing unit 32, a result retaining unit 33, a reference retaining unit 34 and a selector 35.

The error data retaining unit 31 receives the packet from the S/P converting unit 121 and, when the error detection unit 122 detects the error of the packet and when this packet is categorized as a retransmit type of packet, retains the packet in the buffer.

The error data comparing unit 32 compares the packet retransmitted based on the error with the packet retained by the error data retaining unit 31 and outputs, as a result of this comparison, information indicating which bit the error corresponds to. For example, the error data comparing unit 32 takes an exclusive OR of the bits of these two packets in sequence, and outputs "false=0" if bits of the two packet are coincident with each other and "true=1" whereas not coincident. Namely, the error bit is indicated depending on which bit becomes "1".

The result retaining unit 33 is a memory which retains the result of the comparison by the error data comparing unit 32.

The reference retaining unit 34 is a register which retains a reference packet of the same bit pattern as the fixed packet, e.g., the Null packet has. The selector 35 selects, corresponding to whether the error packet can be retransmitted or not, the packet coming from the error data retaining unit 31 or the reference packet from the reference retaining unit 34, and transmits the selected packet to the error data comparing unit 32.

The decoder 124 extracts the packet type from the received packet, and outputs a value corresponding to the packet type. For example, the decoder 124 outputs, to the gate unit 126, "true=1" during a period of receiving a predetermined packet type, i.e., a normal packet in the first embodiment and "false=0" during a period of not receiving the normal packet. Further, the decoder 124 extracts the next packet type from each packet and transmits the extracted packet type to the packet type determining unit 127.

Figure 4:
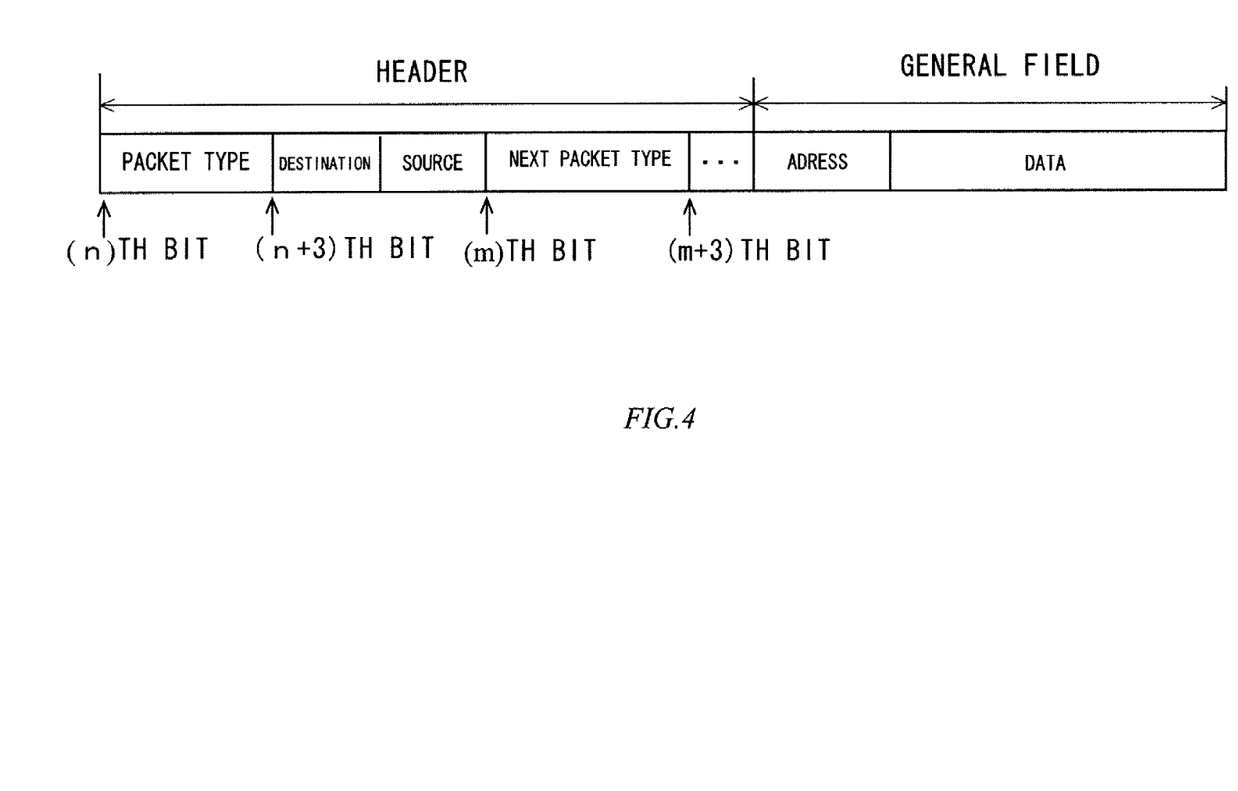
FIG. 4 is an explanatory diagram of fields provided in a packet.

FIG. 4 is an explanatory diagram of fields held by the packet in the first embodiment. As depicted in FIG. 4, the packet has the header and general fields. The header contains a packet type ("packet type" field) indicating a type of the packet, information ("destination" field) indicating a destination of the data, information ("source" field) indicating a source (sender) of the data and a next packet type ("next packet type" field) indicating a type of the next packet. To be specific, in the packet, the packet type field is defined by bits ranging from n-th bit to (n+3)th bit, and the next packet type field is defined by bits ranging from m-th bit to (m+3)th bit. Further, the general fields contain a "real data" field and an "address" field. The general fields are (registered with) information used in the circuit of a transfer destination, and therefore the descriptions thereof are herein omitted.

Accordingly, the decoder 124 extracts the bits ranging from n-th bit to (n+3)th bit as the packet type from the packet, and extracts the bits ranging from m-th bit to (m+3)th bit as the next packet type from the packet.

The gate units 125, 126 control as to whether to let the input signal pass through or not, depending on a result of the detection. The gate units 125, 126 in the first embodiment are circuits which output OR of a signal into which the detection result of the error detection unit 122 is inverted and the input signal. Namely, the gate unit 125 lets the packet pass through if the detection result given from the error detection unit 122 is "false=0" but does not let the packet pass through if the detection result is "true=1". Moreover, the gate unit 126 lets the output of the decoder 124 pass through if the detection result given from the error detection unit 122 is "false=0" but does not let the output of the decoder 124 pass through if the detection result is "true=1".

The packet type determining unit 127 determines based on the next packet type given from the decoder 124 whether the next packet is a retransmit enable packet or not.

Figure 5:
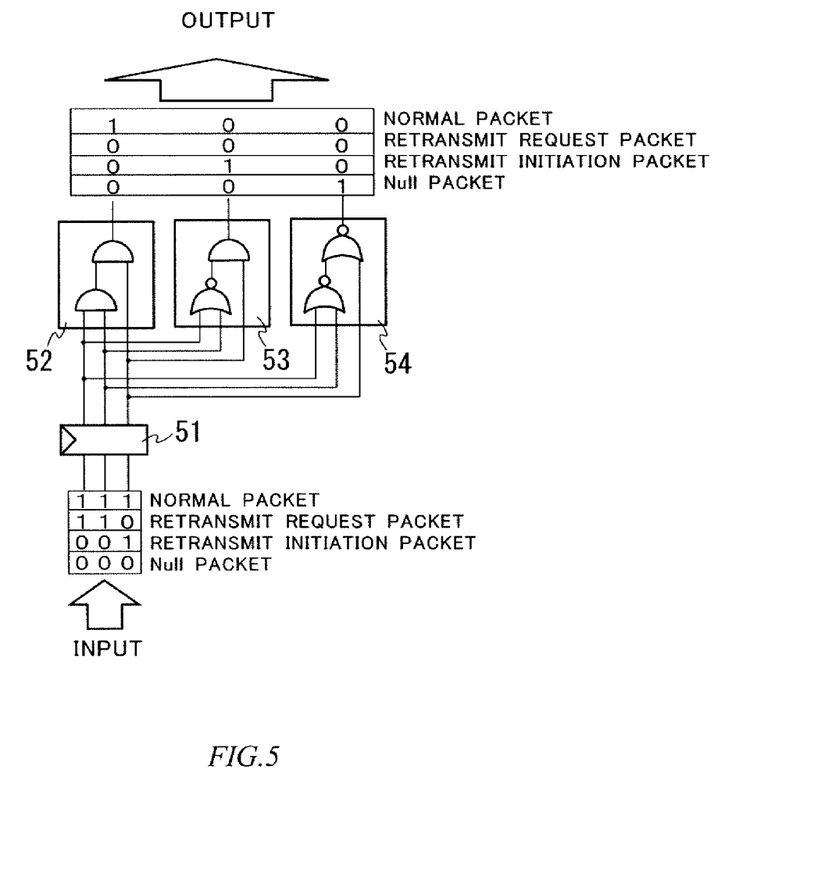
FIG. 5 is an explanatory diagram of a packet type determining unit.

FIG. 5 is an explanatory diagram of the packet type determining unit 127. As depicted in FIG. 5, the packet type determining unit 127 in the first embodiment includes a delay unit 51, a retransmit determining unit 52, a retransmit initiation determining unit 53 and a fixed packet determining unit 54.

The delay unit 51, when receiving the next packet type from the decoder 124, temporarily stores the next packet type in the buffer, and outputs the next packet type stored one before, thus transmitting the next packet type with a delay for one packet to the retransmit determining unit 52, the retransmit initiation determining unit 53 and the fixed packet determining unit 54. Namely, the next packet type specifies the type of the next packet, and hence the delay unit 51 adjusts the timing of the transmission to the retransmit determining unit 52, the retransmit initiation determining unit 53 and the fixed packet determining unit 54 by delaying the next packet type for one packet.

The retransmit determining unit 52 outputs a value corresponding to the next packet type received via the delay unit 51. For example, "111" is set for the packet type of the normal packet, "110" is for the packet type of the retransmit request packet, "001" is for the packet type of the retransmit initiation packet and "000" is for the packet type of the Null packet, in which case the retransmit determining unit 52 outputs a value=1, which represents a retransmit enable status when "111" is inputted. Namely, the retransmit determining unit 52 outputs a value=0, which represents a retransmit disable status when "110", "001" and "000" are inputted. Specifically, the retransmit determining unit 52 outputs AND of the respective bits of the inputted packet types. It should be noted that the determination of which packet type is retransmission-enabled is not limited to this example, and an available scheme is that the Null packet defined as the fixed packet and the retransmit initiation packet are set as retransmit disable packets, while the normal packet not defined as the fixed packet and the retransmit request packet are set as retransmit enable packets.

Further, the retransmit initiation determining unit 53 outputs the value="1", which indicates that the packet is the retransmit initiation packet when "001" is inputted and outputs the value="0", which indicates that the packet is not the retransmit initiation packet when "111", "110" and "000" are inputted. To be specific, the retransmit initiation determining unit 53 takes NOR of the first bit and the second bit of the inputted packet type, and outputs AND of a result of this NOR and the third bit.

The fixed packet determining unit 54 outputs the value="1", which indicates that the packet is the fixed packet when "000" is inputted and outputs the value="0", which indicates that the packet is not the fixed packet when "111", "110" and "001" are inputted. Specifically, the fixed packet determining unit 54 outputs NOR of the respective bits of the inputted packet type.

The counter 128 counts the output signals of the gate unit 126 and notifies the retransmit management unit 129 of a count value. Namely, the counter 128 notifies the retransmit management unit 129 of a packet count of the normal packets from which any error is not detected.

The retransmit management unit 129, if the packet determined to be the error packet by the error detection unit 122 is the retransmit enable packet, requests this packet to be retransmitted by sending the retransmit request signal to the transmission unit 11. At this time, the retransmit management unit 129 transmits the number obtained from the counter 128 as a retransmit buffer number to the transmission unit 11.

Further, the retransmit management unit 129, when receiving the retransmit request packet from the S/P converting unit 121, notifies the transmission unit 11 of the retransmission based on the retransmit request packet. For instance, the retransmit management unit 129 sends the retransmit buffer number contained in the received packet to the retransmit buffer 42. Moreover, the retransmit management unit 129 gets the packet generation unit 23 of the transmission unit 11 to send the retransmit initiation packet by transmitting the retransmit enable signal to this packet generation unit 23, and also transmits a retransmit select signal to the selector 21. With this process, the transmission unit 11 reads the packet specified by the retransmit buffer number from the retransmit buffer 42 and transmits the thus-specified packet to the selector 21, and the selector 21 selects the retransmit packet and sends this packet to the posterior stage.

Further, the retransmit management unit 129, when making the selector 22 select the packet, i.e., the normal packet transmitted from the selector 21 to the selector 22, transmits a normal select signal to the coder 113.

Note that when the transmitted packet is received without any error, the reception unit 12 sends Ack (Acknowledgement) purporting that the packet is received, and therefore the retransmit management unit 129 makes a retransmit request also if there is no Ack for a fixed period of time.

The retransmit management unit 129 includes a processor which processes and thus outputs the inputted signal as described above. Namely, the processor executes an arithmetic process according to a predetermined piece of software, thereby realizing a function of the retransmit management unit 129. It should be noted that the retransmit management unit 129 may also be configured to realize, without being limited to the softwarewise process by the processor, the function hardwarewise in a way that combines switches such as logic gates, comparators and transistors.

Figure 6:
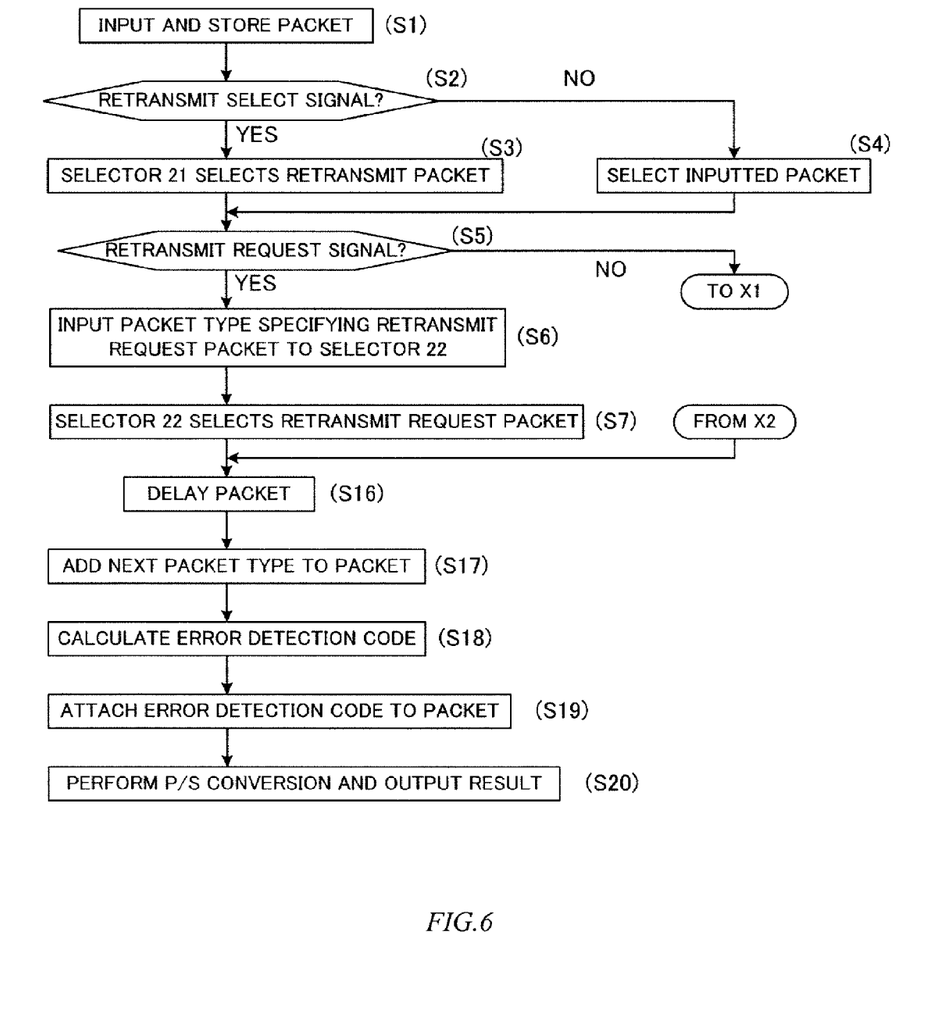
FIG. 6 is an explanatory flowchart of a control method when the data transfer device transmits data.
Figure 7:
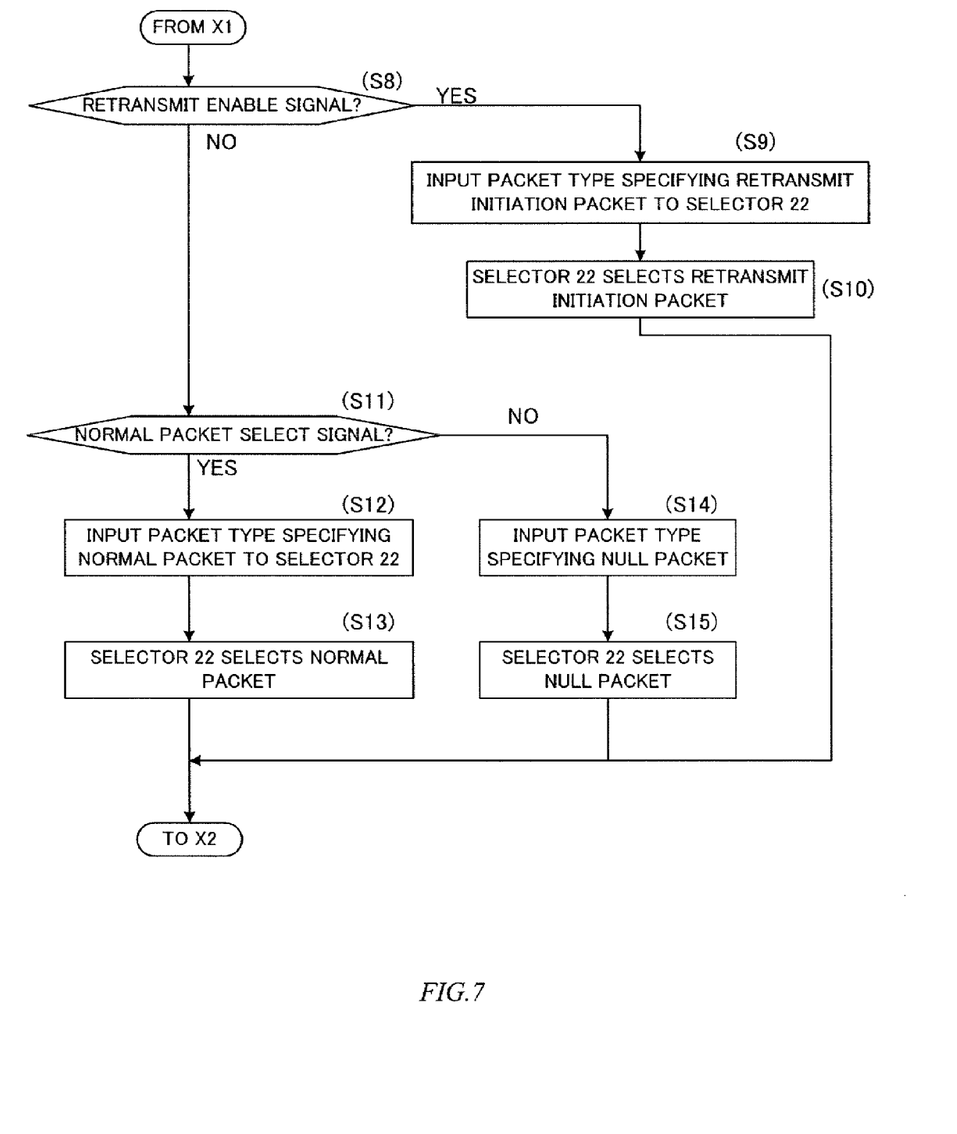
FIG. 7 is an explanatory flowchart of the control method when the data transfer device transmits the data.

FIGS. 6 and 7 are explanatory flowcharts of a control method on such an occasion that the data transfer device 100 having the configuration described above transmits the data. FIGS. 6 and 7 each illustrate a processing flow executed by the respective units of the data transfer device 100 on a per packet basis.

To begin with, upon inputting the packet to the input port 41, the input unit 114 stores the packet in the retransmit buffer 42 (S1).

The selector 21 sends, corresponding to the retransmit select signal from the retransmit management unit 129, the retransmit packet or the packet from the input port 41 to the posterior stage. Herein, the selector 21 transmits the retransmit packet from the retransmit buffer 42 to the selector 22 (S3) when receiving the retransmit select signal (S2, Yes), and transmits the packet from the input port 41 to the selector 22 (S4) when not receiving the retransmit select signal (S2, No).

Next, the coder 113 inputs, based on the normal select signal, the retransmit request signal or the retransmit enable signal sent from the retransmit management unit 129, the packet type specifying the packet to be transmitted to the posterior stage as the select signal to the selector 22. For example, the coder 113 inputs, when receiving the retransmit request signal from the retransmit management unit 129 (S5, Yes), the packet type specifying the retransmit request packet to the selector 22 (S6), and the selector 22 selects the retransmit request packet sent from the packet generation unit 24 (S7).

Further, the coder 113 transmits, when receiving not the retransmit request signal but the retransmit enable signal from the retransmit management unit 129 (S8, Yes), the packet type which specifies the retransmit initiation packet to the selector 22 (S9), and the selector 22 selects the retransmit initiation packet sent from the packet generation unit 23 (S10).

Moreover, the coder 113 transmits, when receiving neither the retransmit request signal nor the retransmit enable signal but the normal select signal (S11, Yes), the packet type specifying the normal packet to the selector 22 (S12), and the selector 22 selects the normal packet sent from the selector 21 (S13).

Then, the coder 113 inputs, when receiving neither the retransmit request signal nor the retransmit enable signal nor the normal select signal (S11, No), i.e., when receiving none of the significant data, the packet type specifying the Null packet to the selector 22 (S14), and the selector 22 selects the Null packet sent from the packet generation unit 25 (S15).

Note that in steps S4, S7, S10 and S11, the coder 113 notifies also the signal synthesizing unit 26 of the packet type.

Next, the delay unit 27 stores, in the register, the packet received from the selector 22 and transmits the packet stored one before to the posterior stage. Namely, the delay unit 27 delays the packet to be transmitted to the posterior stage by one packet (S16).

Then, the signal synthesizing unit 26 attaches the packet type received from the coder 113 to the packet delayed by the delay unit 27. Namely, the signal synthesizing unit 26 attaches the packet type of the next packet to each packet (S17).

Next, the error detection code generation unit 111 calculates the error detection code, i.e., the CRC code in the first embodiment, of the packet received from the signal synthesizing unit 26 (S18), and the signal synthesizing unit 28 attaches the error detection code to the packet received from the signal synthesizing unit 26 (S19).

The P/S converting unit 29 converts the signal of the packet given from the signal synthesizing unit 28 into the serial signal from the parallel signal, and transmits the thus-converted packet to the transmission path 19 (S20).

Figure 8:
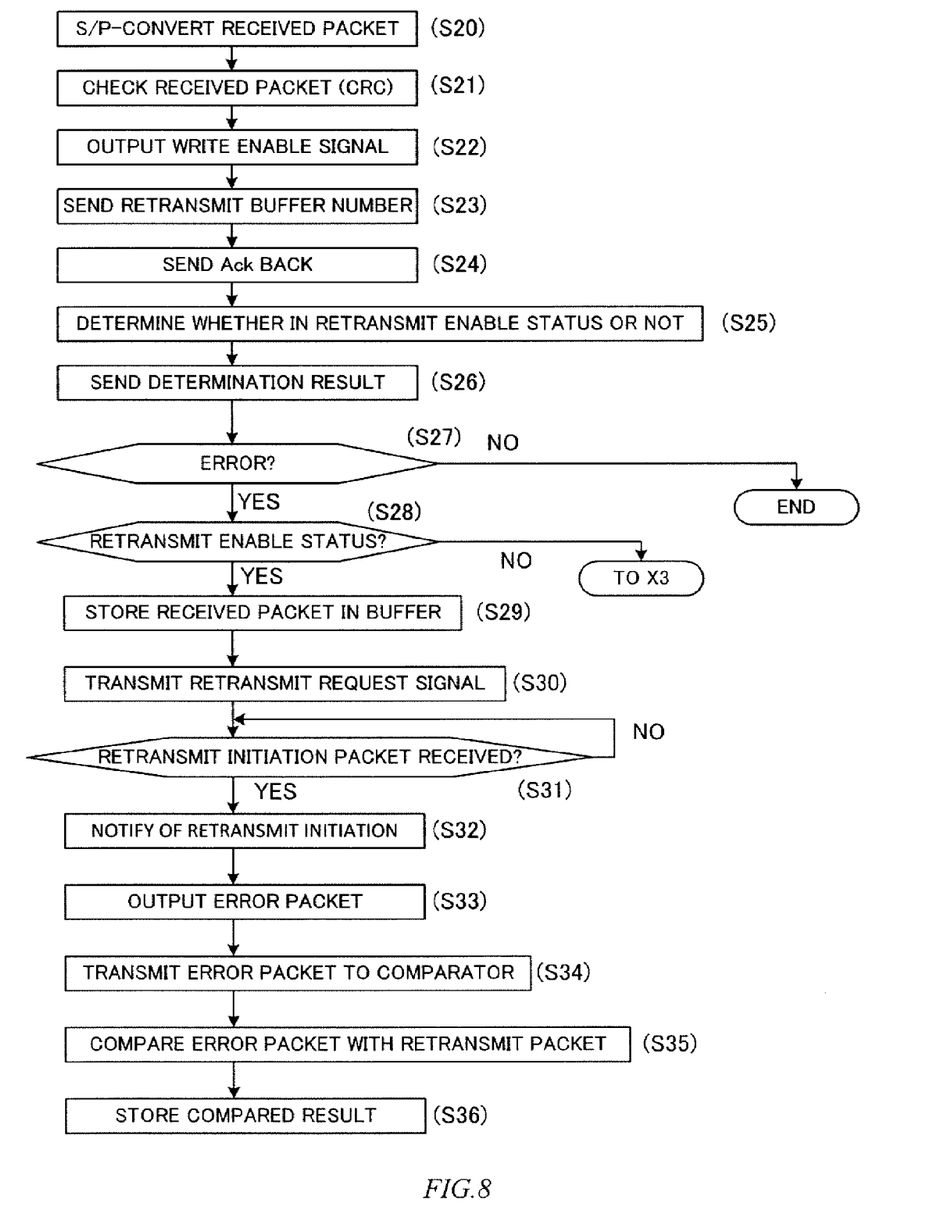
FIG. 8 is an explanatory flowchart of a control method when the data transfer device receives the data.
Figure 9:
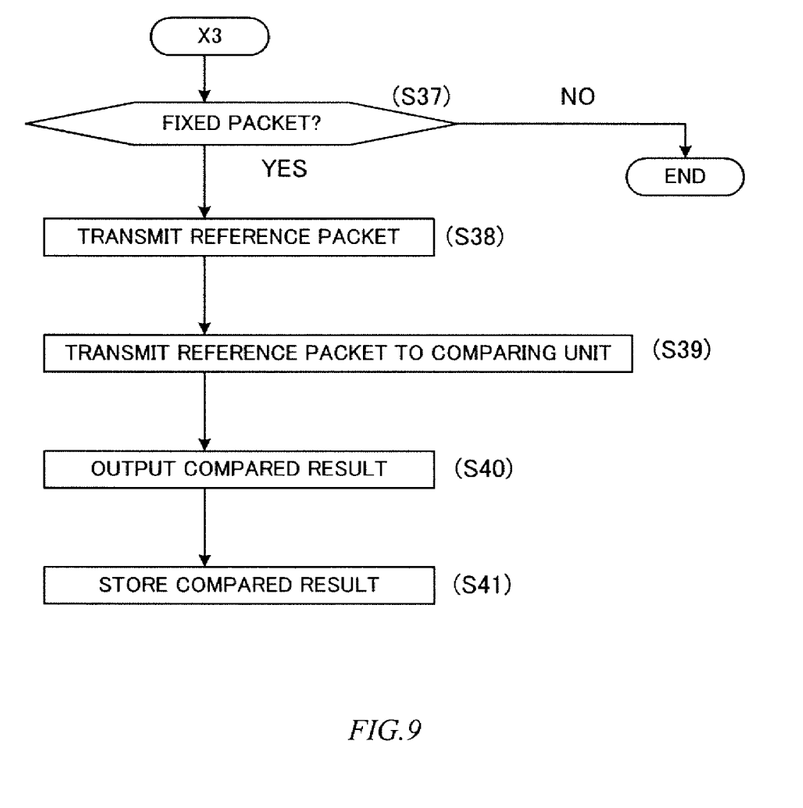
FIG. 9 is an explanatory flowchart of the control method when the data transfer device receives the data.

FIGS. 8 and 9 are explanatory flowcharts illustrating a control method when the data transfer device in the first embodiment receives the data. FIGS. 8 and 9 each illustrate a processing flow executed on a packet-by-packet basis by the respective units of the data transfer device 100.

To start with, the S/P converting unit 121 converts the serial signal received from the transmission path 19 into the parallel signal (S20).

Then, the error detection unit 122 performs the CRC of the packet and outputs a result of the detection, i.e., a result of whether the error occurs or not (S21).

Further, the decoder 124 extracts the next packet type from the received packet, then sends the extracted packet type to the packet type determining unit 127, and transmits a value corresponding to the packet type of the received packet as a write enable signal to the output port 131, whereby the write enable signal is output together with each packet from the output port 131. The decoder 124 in the first embodiment outputs "true=1" during a period of receiving the normal packet and "false=0" during a period of not receiving the normal packet (S22). With this operation, the write enable signal indicates the timing at which the normal packet is output to the circuit of the packet transfer destination.

Furthermore, the write enable signal comes to "true=1" each time the packet is output without any error, and hence a write enable signal count represents a normally-output packet count. Accordingly, if the write enable signal count is known when the error occurs in the packet, it is feasible to specify which packet inclusive delimits the normally-output packets and which packet undergoes the occurrence of error. Such being the case, the counter 128 transmits the count result of the write enable signals as the retransmit buffer number to the retransmit management unit 129 (S23). Further, the retransmit management unit 129 sends, when receiving the packet without any error, Ack purporting that the packet is received back to the input unit 114 of the transmission unit 11 (S24).

Moreover, the packet type determining unit 127 receiving the next packet type from the decoder 124 determines whether this packet type is of the retransmit enable status or not (S25), and sends a result of this determination to the error determining unit 123 and the retransmit management unit 129 (S26). The packet type determining unit 127 in the first embodiment sends the value "1" representing the retransmit enable status if the packet type specifies the normal packet and the value "0" representing the retransmit disable status if the packet type specifies the packet other than the normal packet.

Then, the error determining unit 123 determines whether or not there is the error given from the error detection unit 122 (S27), and determines, if there is the error, whether the determination result received from the packet type determining unit 127 indicates the retransmit enable status or not (S28). Herein, if the determination result indicates the retransmit enable status (S28, Yes), the error determining unit 123 stores the packet received from the S/P converting unit 121 in the error data retaining unit 31 (S29).

Then, the retransmit management unit 129 transmits the retransmit request signal to the coder 113 and the packet generation unit 24 as well as transmitting the retransmit buffer number given from the counter 128 to the packet generation unit 24 of the transmission unit 11 (S30).

After making the retransmit request, the packet type determining unit 127 waits for the retransmit packet to be reached. Namely, the packet type determining unit 127 determines whether the retransmit initiation packet is received or not (S31) and, if the retransmit initiation packet is received (S31, Yes), notifies the error determining unit 123 of a value representing the retransmit initiation (S32).

In the case of receiving the value representing this retransmit initiation, the retransmit packet is transmitted next, and therefore the error data retaining unit 31 of the error determining unit 123 outputs the error packet stored in S29 (S33). Herein, the determination result of the packet type determining unit 127 indicates the retransmit enable status, and hence the selector 35 transmits the packet given from the error data retaining unit 31 to the comparing unit 32 (S34). Note that as for the packet from the error data retaining unit 31, this packet is output from the error data retaining unit 31 at the timing of being inputted to the comparing unit 32 simultaneously with the packet received next to the retransmit initiation packet from the S/P converting unit 121.

The comparing unit 32 compares the respective bits of both of the inputted packets, and outputs a result of the comparison (S35). For instance, the comparing unit 32 outputs "false=0" if the bits of both of the packets are the same and "true=1" whereas if different from each other, thereby specifying the error bit.

Then, the result retaining unit 33 retains the result of the comparison of the comparing unit 32 (S36).

While on the other hand, if the determination result of the packet type determining unit 127 indicates the retransmit disable status and if the value representing the fixed packet is received from the packet type determining unit 127 (S37, Yes), the reference retaining unit 34 of the error determining unit 123 reads and then sends the reference packet to the selector 35 (S38).

Since the determination result of the packet type determining unit 127 indicates the retransmit disable status (S28, No), the selector 35 selects the reference packet from the reference retaining unit 34 and sends this packet to the comparing unit 32 (S39).

The comparing unit 32 compares the respective bits of both of the inputted packets and outputs a result of the comparison (S40). Then, the result retaining unit 33 retains the comparison result of the comparing unit 32 (S41). Thus, as the Null packet is categorized into the fixed packet, and therefore, even when the error occurs, the transfer device in the first embodiment reads the reference packet and compares this reference packet with the error packet without making the retransmit request.

Note that even if the determination result of the packet type determining unit 127 indicates the retransmit disable status (S28, No) and if the value representing the fixed packet from the packet type determining unit 127 is not received (S37, No), the process about the packet concerned is finished without making the comparison with the error packet. Namely, even when errors exist in the retransmit request packet and in the retransmit initiation packet, the retransmit management unit 129 of the second transfer circuit 10 does not make the retransmit request. Note that the normal packet retransmitted in response to the retransmit request packet with the error caused and the packet retransmitted subsequently to the retransmit initiation packet with the error caused are, because of Ack not being sent back to the first transfer circuit 1, retransmitted after a fixed period of time by the retransmit management unit 129 of the first transfer circuit 1.

As described above, the data transfer device in the first embodiment, since the reception unit 12 retains the error packet if the error occurs, can make the comparison with the retransmitted packet. With this operation, the data transfer device in the first embodiment can specify which part of the error packet the error exists in. Further, the data transfer device in the first embodiment can determine based on the retransmit enable information whether the packet retransmit request is made or not.

Further, the data transfer device in the first embodiment can, as the next packet type is attached to each packet, identify the packet type of the error packet from the next packet information attached to the packet anterior to the error packet if the error occurs, and can also determine whether the error packet can be retransmitted or not.

Moreover, the data transfer device in the first embodiment compares the data, from which the error is detected, retained by the error data retaining unit with the retransmitted data from which the error is detected, thereby specifying the bit with the error caused in the error-detected data.

Furthermore, the data transfer device in the first embodiment can transmit the retransmit request packet to the data transmitting circuit 1 and retransmits the packet with error caused, thereby enabling the error packet to be compared with the retransmit packet.

The data transfer device in the first embodiment transmits the retransmit initiation packet to the data receiving circuit 10 and notifies this circuit 10 of the retransmit initiation of the retransmit packet, thereby enabling the error packet to be compared with the retransmit packet.

The data transfer device in the first embodiment, when not transmitting the normal packet, transmits the fixed packet as the Null packet. If the error occurs in the fixed packet, the data transfer device compares the reference packet with the error packet without making the request for the retransmission, whereby the error part can be specified. With this contrivance, the data transfer device in the first embodiment prevents a decline of transfer efficiency by restraining a retransmit quantity of the packets while enabling the error part to be specified.

It should be noted that in the first embodiment the data transfer device attaches, to each packet, the retransmit enable information representing that the packet to be transmitted next can be retransmitted, and may also attach to each packet the retransmit enable information representing that the packet to be transmitted afterward without being limited to the next can be transmitted (retransmitted).

Second Embodiment

Figure 10:
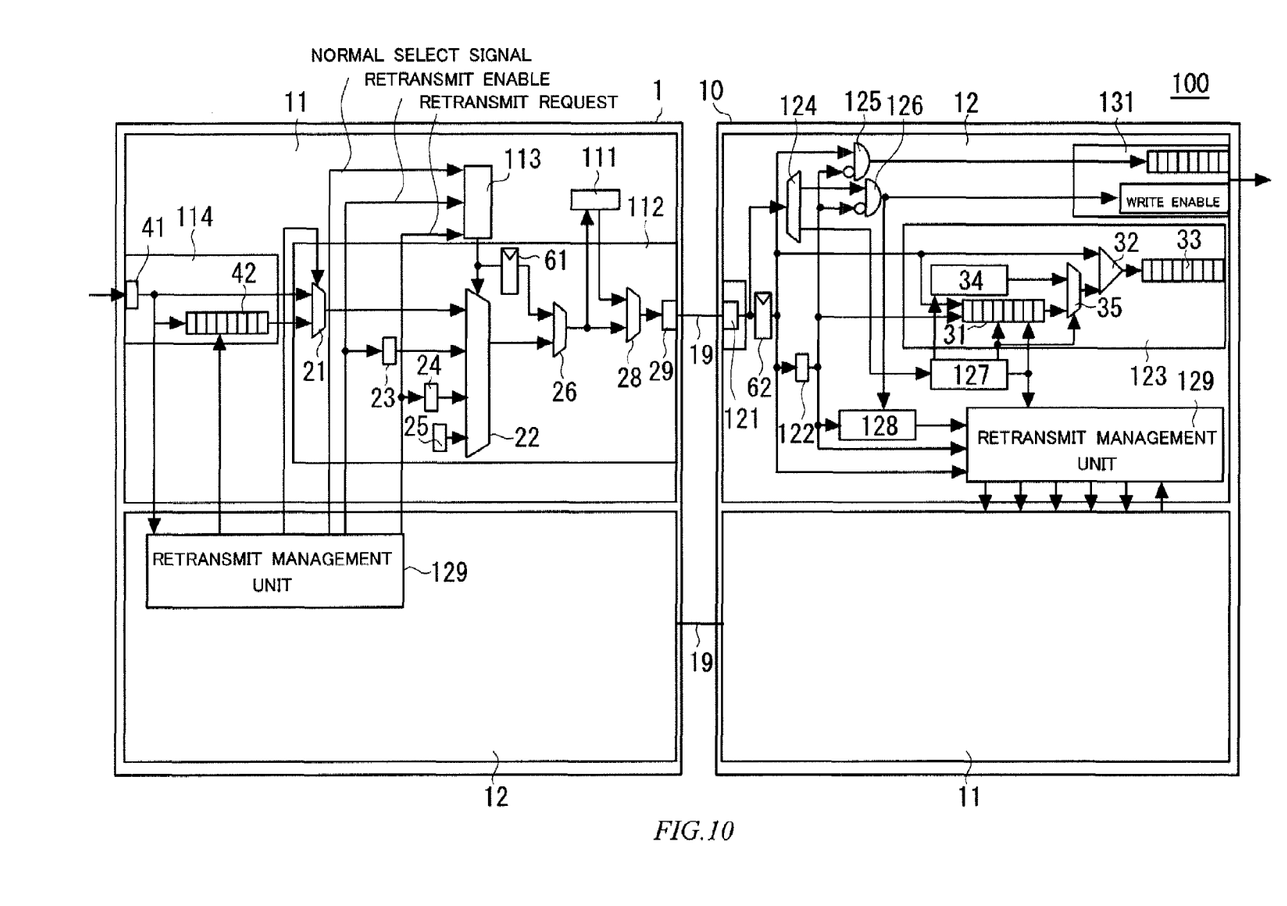
FIG. 10 is a diagram illustrating configurations of the transmission unit on the side of the transmitting circuit and the reception unit on the side of the receiving circuit in a second embodiment.

FIG. 10 is a diagram illustrating a configuration of the transmission unit (transmission unit on the side of the transmitting circuit) 11 of the first transfer circuit 1 and a configuration of the reception unit (reception unit on the side of the relieving circuit) 12 of the second transfer circuit 10, which receives the data from the transmission unit 11. Further, FIG. 11 is a diagram illustrating a configuration of the transmission unit (transmission unit on the side of the receiving circuit) 11 of the second transfer circuit 10 and a configuration of the reception unit (reception unit on the side of the transmitting circuit) 12 of the first transfer circuit 1, which receives the data from the transmission unit 11 in the data transfer device according to a second embodiment.

In the first embodiment discussed above, the packet type of the next packet is attached to each packet, and by contrast the second embodiment has a different configuration of attaching the packet type of the anterior packet to each packet. Note that other configurations are the same, and hence, as compared with the first embodiment discussed above, the repetitive explanations are omitted in a manner that marks the same components with the same numerals and symbols.

Figure 11:
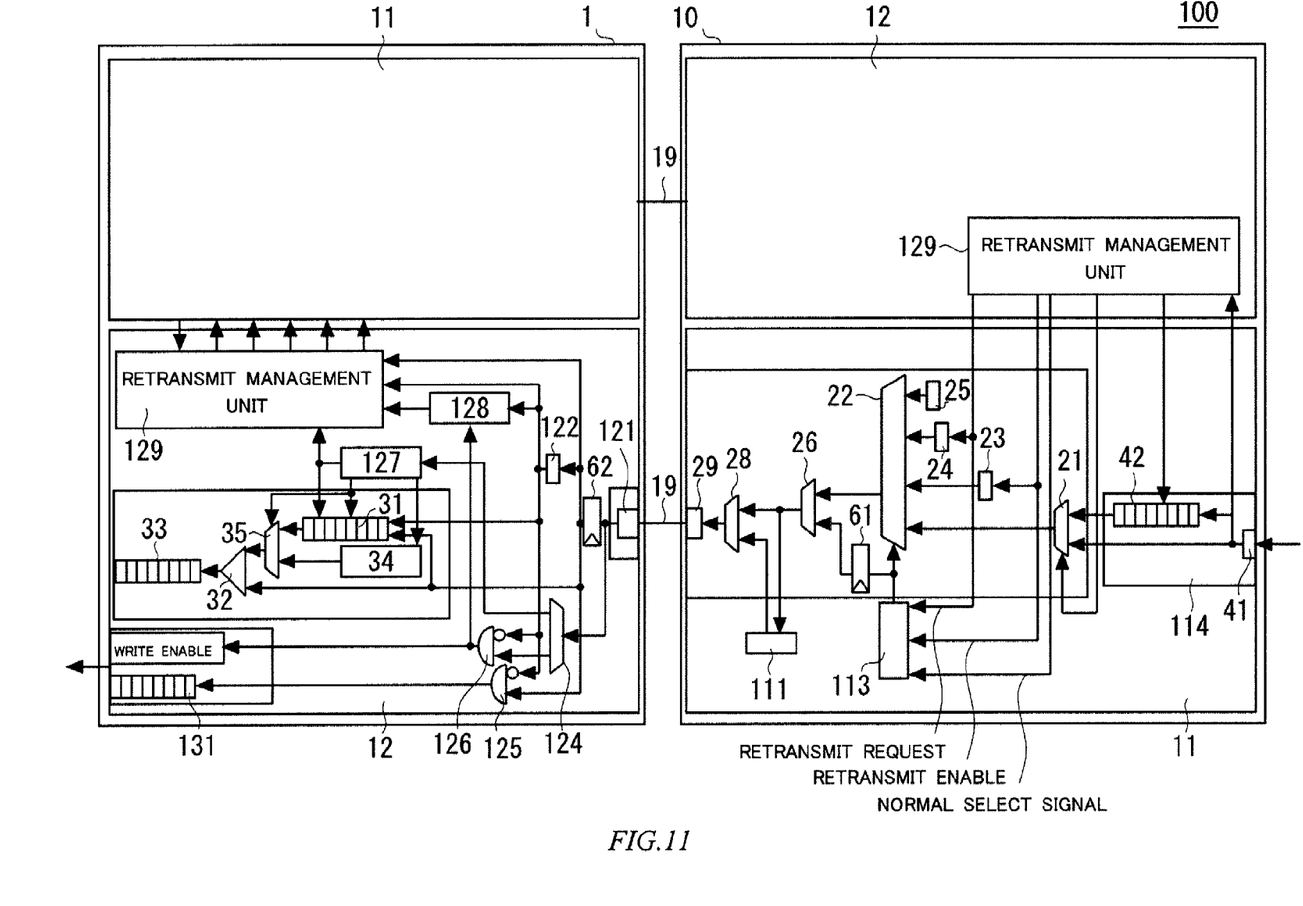
FIG. 11 is a diagram illustrating configurations of the transmission unit on the side of the receiving circuit and the reception unit on the side of the transmitting circuit in the second embodiment.

As depicted in FIGS. 10 and 11, the transmission unit 11 includes a delay unit 61 between the coder 113 and the signal synthesizing unit 26.

The delay unit 61 temporarily stores the packet type output from the coder 113 in the register, and sends the packet type stored one before to the posterior stage. Namely, the delay unit 61 sends the packet type with a delay for one packet to the signal synthesizing unit 26.

Then, the signal synthesizing unit 26 attaches the packet type delayed by the delay unit 61 to the packet inputted from the selector 22. Namely, the signal synthesizing unit 26 attaches the anterior packet type, which specifies the packet type of the previous packet, to each packet.

The signal synthesizing unit 26 in the second embodiment adds, to the packet, the anterior packet type in place of the next packet type in, e.g., FIG. 4.

Further, the reception unit 12 in the second embodiment includes a delay unit 62 at the posterior stage of the S/P converting unit 121. The delay unit 62 temporarily stores the packet received from the S/P converting unit 121 in the register and transmits the packet stored one before to the posterior stage. Namely, the delay unit 62 delays the packet by one packet, which is transmitted to the error determining unit 123, the error detection unit 122 and the retransmit management unit 129.

Moreover, the decoder 124 in the second embodiment extracts the anterior packet type from the received packet, and outputs a value corresponding to the anterior packet type as the write enable signal. Furthermore, the decoder 124 extracts the anterior packet type from each of the packets received from the S/P converting unit 121 and sends the extracted packet type to the packet type determining unit 127. Note that the packet type determining unit 127 in the second embodiment excludes the delay unit in FIG. 5, in which the anterior packet type received from the decoder 124 is sent, without being delayed, to the retransmit determining unit 52, the retransmit initiation determining unit 53 and the fixed packet determining unit 54.

Thus, in the second embodiment, the packet type determining unit 127 identifies the packet type of the error packet by use of the anterior packet type. Therefore, the delay unit 62 delays the packet transmitted to the retransmit management unit 129 and the error determining unit 123 from the S/P converting unit 121, thus adjusting the timing when the packet and the determination result of the packet type determining unit are sent to the error determining unit 123 and the retransmit management unit 129.

Thus, the data transfer device in the second embodiment attaches the anterior packet type to each packet, and therefore, if the error occurs, the packet type of the error packet can be identified from the previous packet information attached to the packet next to the error packet, whereby it is possible to make the determination as to whether the error packet can be retransmitted or not.

Further, the data transfer device in the second embodiment, similarly to the first embodiment discussed above other than the configuration of employing the anterior packet type, if the error occurs, compares the error packet with the retransmit packet and can specify which part of the error packet the error exists in.

The present invention is not limited to only the illustrated examples given above but can be, as a matter of course, changed in a variety of forms within the scope that does not deviate from the gist of the present invention. Further, the components thereof can be combined to the greatest possible degree.

What is claimed is:

1. A data transfer device comprising:
a data transmitting circuit that transmits data; and
a data receiving circuit that receives the transmitted data,
the data transmitting circuit including:
an error detection code generating unit that generates an error detection code for detecting an error in the data; and
a transmission unit that transmits the data and the generated error detection code together with retransmit enable information representing that corresponding data transmitted before the data or transmitted next the data can be retransmitted,
the data receiving circuit including:
a reception unit that receives the transmitted data, the transmitted error detection code and the transmitted retransmit enable information;
an error detection unit that detects the error in the received data based on the received error detection code;
an error data retaining unit that retains the received data in which the error is detected when the reception unit receives the transmitted retransmit enable information;
an error data comparing unit that compares the error detected data retained in the error data retaining unit with the corresponding data that is retransmitted; and
a reference retaining unit that retains reference data having a predetermined bit pattern,
wherein the reference retaining unit sends the reference data when the received data that the error is detected is fixed data having the predetermined bit pattern, and
the error data comparing unit compares the fixed data that the error is detected with the reference data being sent from the reference retaining unit.

2. The data transfer device according to claim 1, wherein the error data comparing unit specifies a bit with the error caused in the error detected data by comparing the error detected data retained in the error data retaining unit with the retransmitted corresponding data.

3. The data transfer device according to claim 1, wherein the data receiving circuit further includes a second transmission unit that transmits data containing retransmit request information for requesting retransmission with respect to the received data in which the error is detected by the error detection unit to the data transmitting circuit.

4. The data transfer device according to claim 3, wherein the transmission unit transmits data containing retransmit initiation information representing that the data with the error detected by the error detection unit starts being retransmitted in response to the data containing the retransmit request information for requesting the retransmission, that is transmitted by the second transmission unit.

5. The data transfer device according to claim 1, wherein the data is significant data other than fixed data having a predetermined bit pattern, and
the data transmitting circuit periodically transmits the fixed data to the data receiving circuit when the significant data is not transmitted.

6. A data receiving circuit connected to a data transmitting circuit that transmits data, the data receiving circuit comprising:
the data transmitting circuit includes an error detection code generating unit that generates an error detection code for detecting an error in the data; and a transmission unit that transmits the data and the generated error detection code together with retransmit enable information representing that corresponding data transmitted before the data or transmitted next the data can be retransmitted,
a reception unit that receives the transmitted data, the transmitted error detection code and the transmitted retransmit enable information;
an error detection unit that detects the error in the received data based on the received error detection code;
an error data retaining unit that retains the received data in which the error is detected when the reception unit receives the transmitted retransmit enable information;
an error data comparing unit that compares the error detected data retained in the error data retaining unit with the corresponding data that is retransmitted; and
a reference retaining unit that retains reference data having a predetermined bit pattern,
wherein the reference retaining unit sends the reference data when the received data that the error is detected is fixed data having the predetermined bit pattern, and
the error data comparing unit compares the fixed data that the error is detected with the reference data being sent from the reference retaining unit.

7. The data receiving circuit according to claim 6, wherein the error data comparing unit specifies a bit with the error caused in the error detected data by comparing the error detected data retained in the error data retaining unit with the retransmitted corresponding data.

8. The data receiving circuit according to claim 6, further comprising:
a second transmission unit that transmits data containing retransmit request information for requesting retransmission with respect to the received data in which the error is detected by the error detection unit to the data transmitting circuit.

9. A control method of a data transfer device including a data transmitting circuit that transmits data and a data receiving circuit that receives the transmitted data, the control method comprising:
generating, by an error detection code generating unit included in the data transmitting circuit, an error detection code for detecting an error in the data;
transmitting, by a transmission unit included in the data transmitting circuit, the data and the generated error detection code together with retransmit enable information representing that corresponding data transmitted before the data or transmitted next the data can be retransmitted;
receiving, by a reception unit included in the data receiving circuit, the transmitted data, the transmitted error detection code and the transmitted retransmit enable information;
detecting, by an error detection unit included in the data receiving circuit, the error in the received data based on the received error detection code;
retaining, by an error data retaining unit included in the data receiving circuit, the received data in which the error is detected when the reception unit receives the transmitted retransmit enable information;
comparing, by an error data comparing unit included in the data receiving circuit, the error detected data retained in the error data retaining unit with the corresponding data that is retransmitted; and
retaining, by a reference retaining unit included in the data receiving circuit, reference data having a predetermined bit pattern,
wherein the reference retaining unit sends the reference data when the received data that the error is detected is fixed data having the predetermined bit pattern, and
the error data comparing unit compares the fixed data that the error is detected with the reference data being sent from the reference retaining unit.

10. The control method of the data transfer device according to claim 9, wherein the error data comparing unit specifies a bit with the error caused in the error detected data by comparing the error detected data retained in the error data retaining unit with the retransmitted corresponding data.

11. The control method of the data transfer device according to claim 9, the control method further comprising:
transmitting, by a second transmission unit included in the data receiving circuit, data containing retransmit request information for requesting retransmission with respect to the received data in which the error is detected by the error detection unit to the data transmitting circuit.

12. The control method of the data transfer device according to claim 11, the control method further comprising:
transmitting, by the transmission unit, data containing retransmit initiation information representing that the data with the error detected by the error detection unit starts being retransmitted in response to the data containing the retransmit request information for requesting the retransmission, which is transmitted by the second transmission unit.

13. The control method of the data transfer device according to claim 9, the control method further comprising:
the data is significant data other than fixed data having a predetermined bit pattern,
periodically transmitting, by the data transmitting circuit, the fixed data to the data receiving circuit when the significant data is not transmitted.

* * * * *